US011380557B2

(12) United States Patent
Kirchhoff et al.

(10) Patent No.: US 11,380,557 B2
(45) Date of Patent: Jul. 5, 2022

(54) APPARATUS AND METHOD FOR GAS DELIVERY IN SEMICONDUCTOR PROCESS CHAMBERS

(71) Applicant: APPLIED MATERIALS, INC., Santa Clara, CA (US)

(72) Inventors: Vincent Kirchhoff, Morgan Hill, CA (US); Faruk Gungor, San Jose, CA (US); Felix Rabinovich, Cupertino, CA (US); Gary Keppers, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 671 days.

(21) Appl. No.: 15/613,855

(22) Filed: Jun. 5, 2017

(65) Prior Publication Data

US 2018/0350627 A1    Dec. 6, 2018

(51) Int. Cl.
*H01L 21/48* (2006.01)
*H01L 21/67* (2006.01)
(Continued)

(52) U.S. Cl.
CPC .... *H01L 21/4871* (2013.01); *C23C 16/45561* (2013.01); *C23C 16/45565* (2013.01);
(Continued)

(58) Field of Classification Search
CPC ........... H01L 21/4871; H01L 21/67017; H01L 23/367; H01L 21/02; H01L 21/67201;
(Continued)

(56) References Cited

U.S. PATENT DOCUMENTS 2,959,355 A * 11/1960 Houser .................. F04F 5/465
239/75
3,022,232 A * 2/1962 Bailey ...................... C25D 5/22
205/93
(Continued)

FOREIGN PATENT DOCUMENTS

JP          09289195 A  * 11/1997
JP       H09289195 A    11/1997
(Continued)

OTHER PUBLICATIONS

INCO Brochure A313. "Mechanical and Physical Properties of the Austenitic Chromium-Nickel Stainless Steels at Subzero Temperatures." The International Nickel Company, Inc. 1970. pp. 1-24. (Year: 1970).*
(Continued)

*Primary Examiner* — Rudy Zervigon
(74) *Attorney, Agent, or Firm* — Moser Taboada

(57) ABSTRACT

Embodiments of an apparatus for gas delivery in a semiconductor processing system use a gas distribution plate that has a plurality of gas passageways where the passageways have surfaces with an average roughness of less than or equal to approximately 10 Ra. In some embodiments, the gas distribution plate has one or more internal fluid passageways that are capable of being fluidly coupled to one or more fluid sources to provide temperature control of the gas distribution plate. In some embodiments, the gas distribution plate has at least one internal cavity with at least one heatsink that may surround at least one of the plurality of gas passageways to provide, at least partial, temperature control of the gas distribution plate.

12 Claims, 4 Drawing Sheets

(51) Int. Cl.
*C23C 16/455* (2006.01)
*H01J 37/32* (2006.01)
*H01L 23/367* (2006.01)

(52) U.S. Cl.
CPC .... *H01J 37/3244* (2013.01); *H01J 37/32522* (2013.01); *H01L 21/67017* (2013.01); *H01L 23/367* (2013.01)

(58) Field of Classification Search
CPC ......... C23C 16/45561; C23C 16/45565; H01J 37/3244; H01J 37/32522; C25D 1/08
USPC .................. 118/715; 156/345.33, 345.34
See application file for complete search history.

(56) References Cited

U.S. PATENT DOCUMENTS

| | | | | |
|---|---|---|---|---|
| 3,024,519 | A * | 3/1962 | Scholer | H01L 23/48 228/179.1 |
| 3,461,045 | A * | 8/1969 | Franks | C25D 1/02 205/73 |
| 4,530,739 | A | 7/1985 | Hanak et al. | |
| 4,745,670 | A * | 5/1988 | Morris | B23P 15/16 205/75 |
| 4,864,329 | A * | 9/1989 | Kneezel | B41J 2/1601 347/93 |
| 4,909,914 | A * | 3/1990 | Chiba | C23C 8/36 204/164 |
| 5,249,358 | A * | 10/1993 | Tousignant | C25D 1/02 165/908 |
| 5,255,017 | A * | 10/1993 | Lam | B41J 2/162 347/47 |
| 5,277,783 | A * | 1/1994 | Ohashi | B41J 2/162 205/75 |
| 5,309,322 | A * | 5/1994 | Wagner | H01L 23/3121 174/252 |
| 5,317,805 | A * | 6/1994 | Hoopman | B23P 15/26 257/E23.098 |
| 5,352,108 | A * | 10/1994 | Kagawa | B29C 59/02 425/174.4 |
| 5,433,835 | A * | 7/1995 | Demaray | C23C 14/3407 204/298.09 |
| 5,442,143 | A * | 8/1995 | Schmidt | H05K 1/0287 174/257 |
| 5,487,822 | A * | 1/1996 | Demaray | C23C 14/3407 204/298.09 |
| 5,968,379 | A * | 10/1999 | Zhao | C23C 16/4586 219/121.52 |
| 5,983,906 | A * | 11/1999 | Zhao | C23C 16/4586 134/1.1 |
| 6,051,286 | A * | 4/2000 | Zhao | C23C 16/4401 427/253 |
| 6,067,797 | A * | 5/2000 | Silverbrook | B41J 2/17596 60/528 |
| 6,079,356 | A * | 6/2000 | Umotoy | C23C 16/455 118/723 E |
| 6,086,677 | A * | 7/2000 | Umotoy | C23C 16/45514 118/715 |
| 6,183,068 | B1 * | 2/2001 | Kashino | B41J 2/14048 347/65 |
| 6,189,482 | B1 * | 2/2001 | Zhao | H01J 37/3244 118/724 |
| 6,214,192 | B1 * | 4/2001 | Hawkins | B41J 2/1433 205/118 |
| 6,343,627 | B1 * | 2/2002 | Hasaka | F17C 7/00 141/18 |
| 6,399,499 | B1 * | 6/2002 | Lee | H01J 9/02 438/692 |
| 6,410,089 | B1 * | 6/2002 | Guo | C23C 16/45565 118/715 |
| 6,415,860 | B1 * | 7/2002 | Kelly | F28F 7/02 165/148 |
| 6,514,376 | B1 * | 2/2003 | Collins | H01J 37/32467 118/723 AN |
| 6,616,767 | B2 * | 9/2003 | Zhao | H01L 21/67103 392/416 |
| 7,976,631 | B2 | 7/2011 | Burrows et al. | |
| 2001/0054483 | A1 * | 12/2001 | Collins | C23C 16/517 156/345.48 |
| 2002/0036675 | A1 * | 3/2002 | Yoshihira | B41J 2/14024 347/56 |
| 2002/0069968 | A1 * | 6/2002 | Keller | C23C 16/455 156/345.33 |
| 2002/0086136 | A1 * | 7/2002 | Ahn | B41J 2/1603 428/137 |
| 2002/0086529 | A1 * | 7/2002 | McFeely | H01L 21/28568 438/681 |
| 2002/0112954 | A1 * | 8/2002 | Evans | C25D 17/08 204/297.1 |
| 2002/0125001 | A1 * | 9/2002 | Kelly | F28F 7/02 165/165 |
| 2002/0157956 | A1 | 10/2002 | Ikeda | |
| 2002/0162741 | A1 * | 11/2002 | Gogh | C23C 14/3407 204/298.12 |
| 2003/0019580 | A1 * | 1/2003 | Strang | C23C 16/45589 156/345.33 |
| 2003/0051665 | A1 * | 3/2003 | Zhao | C23C 16/5096 712/42 |
| 2003/0066607 | A1 * | 4/2003 | White | C23C 16/455 156/345.34 |
| 2003/0124842 | A1 * | 7/2003 | Hytros | C23C 16/45572 438/680 |
| 2003/0132319 | A1 * | 7/2003 | Hytros | C23C 16/45565 239/548 |
| 2003/0160085 | A1 * | 8/2003 | Thach | B23K 20/12 228/112.1 |
| 2003/0167086 | A1 * | 9/2003 | Baum | A61F 2/82 623/1.15 |
| 2003/0222945 | A1 * | 12/2003 | Nagata | B41J 2/14274 347/68 |
| 2004/0051211 | A1 * | 3/2004 | Mastro | B29C 41/085 264/438 |
| 2004/0058070 | A1 * | 3/2004 | Takeuchi | H01L 21/31116 438/715 |
| 2004/0104010 | A1 * | 6/2004 | Kenny | H01L 23/473 165/80.4 |
| 2004/0104022 | A1 * | 6/2004 | Kenny | F28D 15/0266 165/299 |
| 2004/0125563 | A1 * | 7/2004 | Vrtis | F28F 13/00 361/704 |
| 2004/0129211 | A1 * | 7/2004 | Blonigan | C23C 16/455 118/715 |
| 2004/0156478 | A1 * | 8/2004 | Appleby | B23P 15/246 378/147 |
| 2004/0206305 | A1 * | 10/2004 | Choi | C23C 16/45565 118/715 |
| 2004/0206477 | A1 * | 10/2004 | Kenny | F28F 3/086 165/80.4 |
| 2005/0000432 | A1 * | 1/2005 | Keller | C23C 16/5096 118/715 |
| 2005/0005521 | A1 * | 1/2005 | Kaye | B01J 8/0496 48/215 |
| 2005/0006359 | A1 * | 1/2005 | Blakey | C23C 16/455 118/723 E |
| 2005/0008908 | A1 * | 1/2005 | Kaye | F17C 3/00 429/410 |
| 2005/0011125 | A1 * | 1/2005 | Kaye | B01J 8/0285 48/94 |
| 2005/0022448 | A1 * | 2/2005 | Kaye | B01J 19/249 48/95 |
| 2005/0217580 | A1 * | 10/2005 | DeDontney | F28F 7/02 165/148 |
| 2005/0255257 | A1 * | 11/2005 | Choi | F28F 7/02 165/165 |
| 2006/0022070 | A1 * | 2/2006 | Knol | F02M 61/1853 239/533.12 |
| 2006/0141279 | A1 * | 6/2006 | Thuis | B26F 1/26 428/596 |

(56) References Cited

U.S. PATENT DOCUMENTS

| | | | |
|---|---|---|---|
| 2006/0141802 A1* | 6/2006 | Shih | C11D 11/0047 438/753 |
| 2006/0228496 A1* | 10/2006 | Choi | B23P 15/26 257/E23.098 |
| 2007/0022952 A1* | 2/2007 | Ritchie | C23C 16/4402 118/715 |
| 2007/0023144 A1* | 2/2007 | Lee | C23C 14/165 156/345.33 |
| 2007/0026159 A1* | 2/2007 | Deem | C23C 4/131 427/446 |
| 2007/0057998 A1* | 3/2007 | Wang | B41J 2/1433 347/47 |
| 2007/0068629 A1* | 3/2007 | Shih | C23C 16/4401 156/345.34 |
| 2007/0123051 A1* | 5/2007 | Arghavani | H01L 23/473 165/80.4 |
| 2007/0137573 A1* | 6/2007 | Kholodenko | H01J 37/32091 118/723 E |
| 2007/0247492 A1* | 10/2007 | Mori | B41J 2/1433 347/45 |
| 2008/0053638 A1* | 3/2008 | Appleby | G21K 1/02 164/129 |
| 2008/0107809 A1* | 5/2008 | Wu | C23C 16/45502 427/248.1 |
| 2008/0226838 A1* | 9/2008 | Nishimura | C23C 16/0272 427/569 |
| 2008/0236620 A1* | 10/2008 | Shih | B08B 3/08 134/9 |
| 2008/0296351 A1* | 12/2008 | Crockett | B23K 20/021 228/164 |
| 2008/0296354 A1* | 12/2008 | Crockett | B23K 20/24 228/193 |
| 2008/0308228 A1* | 12/2008 | Stevenson | H01J 37/32091 156/345.34 |
| 2009/0000742 A1* | 1/2009 | Okesaku | B24B 5/485 156/345.34 |
| 2009/0081878 A1* | 3/2009 | Dhindsa | H01J 37/32091 438/729 |
| 2009/0095221 A1* | 4/2009 | Tam | C23C 16/34 118/715 |
| 2009/0095222 A1* | 4/2009 | Tam | C23C 16/34 118/723 R |
| 2009/0098276 A1* | 4/2009 | Burrows | C23C 16/45565 427/8 |
| 2009/0111276 A1* | 4/2009 | Dhindsa | C23C 16/4557 438/710 |
| 2009/0305509 A1* | 12/2009 | Stevenson | C23C 16/45565 438/710 |
| 2010/0096569 A1* | 4/2010 | Nguyen | C25D 5/022 250/505.1 |
| 2010/0099263 A1* | 4/2010 | Kao | F28F 3/086 165/80.4 |
| 2010/0180426 A1 | 7/2010 | Huo et al. | |
| 2010/0212148 A1* | 8/2010 | Kawahara | H01J 37/3244 29/825 |
| 2010/0288479 A1* | 11/2010 | Meng | B01J 19/249 48/95 |
| 2010/0300359 A1* | 12/2010 | Armour | C23C 16/45565 118/724 |
| 2010/0310785 A1* | 12/2010 | Sasakawa | C23C 16/4401 427/457 |
| 2011/0052833 A1* | 3/2011 | Hanawa | C23C 16/4404 427/534 |
| 2011/0056837 A1* | 3/2011 | Lee | B29C 33/3814 205/50 |
| 2011/0283942 A1* | 11/2011 | Iwata | C23C 16/4404 118/725 |
| 2012/0037596 A1* | 2/2012 | Eto | B01J 8/0285 48/94 |
| 2012/0052216 A1* | 3/2012 | Hanawa | C23C 16/45565 427/582 |
| 2012/0276403 A1* | 11/2012 | Nakagawa | C25D 15/00 428/610 |
| 2013/0299009 A1 | 11/2013 | Jiang et al. | |
| 2014/0047714 A1* | 2/2014 | Van Der Sluis | B41J 2/162 29/890.1 |
| 2014/0053776 A1* | 2/2014 | Lee | C23C 16/4402 118/715 |
| 2014/0087488 A1* | 3/2014 | Nam | H01L 21/3065 438/5 |
| 2014/0213061 A1* | 7/2014 | Huang | B28D 5/021 438/710 |
| 2014/0235069 A1 | 8/2014 | Breiling et al. | |
| 2014/0262034 A1* | 9/2014 | Ishibashi | H01J 37/321 156/345.29 |
| 2014/0342176 A1* | 11/2014 | Appleby | F01D 5/147 428/596 |
| 2015/0021324 A1* | 1/2015 | Sun | C23C 14/0021 220/200 |
| 2015/0041329 A1* | 2/2015 | Hussain | F17C 3/00 429/410 |
| 2015/0132602 A1* | 5/2015 | Sun | C25D 15/00 428/610 |
| 2015/0201461 A1* | 7/2015 | Duan | H01L 23/3121 174/252 |
| 2015/0214009 A1 | 7/2015 | Glukhoy | |
| 2016/0322200 A1* | 11/2016 | Alayavalli | H01L 23/48 228/179.1 |
| 2017/0148612 A1 | 5/2017 | Suzuki | |
| 2018/0057940 A1* | 3/2018 | Madsen | B23K 20/1205 |
| 2018/0068868 A1* | 3/2018 | Jaramillo | H01L 23/15 |
| 2018/0138408 A1* | 5/2018 | Lassiter | C23C 14/56 |
| 2018/0312974 A1* | 11/2018 | Noguchi | C25D 17/08 204/297.1 |
| 2018/0348179 A1* | 12/2018 | Staats | G21K 1/02 164/129 |
| 2019/0036026 A1* | 1/2019 | Huang | C23C 14/042 |
| 2019/0043726 A1* | 2/2019 | Yang | F01D 5/147 428/596 |
| 2019/0323127 A1* | 10/2019 | Kalita | B29C 59/02 425/174.4 |

FOREIGN PATENT DOCUMENTS

| | | | | |
|---|---|---|---|---|
| JP | 11104950 A | * | 4/1999 | |
| JP | H11104950 A | | 4/1999 | |
| JP | 2013-026413 A | | 2/2013 | |
| JP | 2013026413 A | * | 2/2013 | |
| WO | WO-0175188 A2 | * | 10/2001 | C23C 16/45589 |
| WO | WO-2017020272 A1 | * | 2/2017 | C25D 1/20 |
| WO | WO-2017073679 A1 | * | 5/2017 | B28B 11/12 |
| WO | WO-2017132908 A1 | * | 8/2017 | C23C 14/042 |

OTHER PUBLICATIONS

S. Hammer et al. "Electroformed Injector Fabrication Techniques." Final Report on Contract No. NAS 7-691. Jan. 31, 1971. Available online at: https://ntrs.nasa.gov/archive/nasa/casi.ntrs.nasa.gov/19710024008.pdf. (Year: 1971).*

ASME B46.1-2009. "Surface Texture (Surface Roughness, Waviness, and Lay)." The American Society of Mechanical Engineers (ASME), New York, NY, US. 2010. pp. 124. (Year: 2010).*

Francisco Arias et al. "Fabrication and Characterization of Microscale Sandwich Beams." Journal of Materials Research. 16 [2] (2001). pp. 597-605. (Year: 2001).*

U.S. Appl. No. 62/513,785, filed Jun. 1, 2017 in the name of Sau Lan Tang Staats, and entitled "Devices and Methods for Liquid Sample Injection for Mass Spectrometry with Improved Utilities." pp. 1-36. (Year: 2017).*

U.S. Appl. No. 62/522,269, filed Jun. 20, 2017 in the name of Sau Lan Tang Staats, and entitled "Devices and Methods for Liquid Sample Injection for Mass Spectrometry with Improved Utilities." pp. 1-36. (Year: 2017).*

U.S. Appl. No. 62/384,923, filed Sep. 8, 2016 in the names of Andres Covarrubias Jaramillo et al., and entitled "Articles Having Holes with Morphology Attributes and Methods for Fabricating the Same." pp. 1-73. (Year: 2016).*

(56) References Cited

OTHER PUBLICATIONS

DT00300-R001-E7. "Application Guide Manual for SURFCOM Series—Surface Roughness & Waviness Parameters." Tokyo Seimitsu Co., Ltd. 2003. pp. 98. Available online: http://gaugeshop.com/_images/roughness/applications_guide_surface_finish.pdf (Year: 2003).*

Kai Hu et al. "Comparison Between ASME and ISO Standards on Surface Texture." Proc. SPIE 6280, Third International Symposium on Precision Mechanical Measurements, 62801W. 2006. pp. 8. doi: 10.1117/12.716169 (Year: 2006).*

Search Report and Written Opinion dated Sep. 21, 2018 for PCT Application No. PCT/US2018/035355.

NiDI Nickel Development Institute, Electroforming—a unique metal fabrication process, Ron Parkinson, NiDI Technical Series N° 10 084, Oct. 98/5.0, 15 pages.

What is Electroforming, http://garelectroforming.com/index.php?route=information/information&information_id=11 Dec. 1, 2016, © Copyright 2016 GAR Electroforming site designed by Dactyl Technologies, LLC, 2 pages.

Supplemental European Search Report for EP 18812876, dated Dec. 22, 2020.

* cited by examiner

APPARATUS AND METHOD FOR GAS DELIVERY IN SEMICONDUCTOR PROCESS CHAMBERS

FIELD

Embodiments of the present disclosure generally relate to gas delivery in semiconductor process chambers used in semiconductor manufacturing systems.

BACKGROUND

Conventional showerheads utilized in semiconductor process chambers (e.g., deposition chambers, etch chambers, or the like) typically include a gas delivery device or 'showerhead' that flows gas into a semiconductor process chamber. The gases are used for various processing purposes such as deposition of a material onto a substrate placed in the process chamber. The delivered gas parameters such as pressure, temperature, and velocity impact the processing of the substrate in the chamber. The flow rate and fluid dynamics through the showerhead impact the delivered gas parameters. Current manufacturing techniques have limited ability to create passageways with smooth fluid flow through the showerhead due to the small sizes of the passageways.

Thus, the inventors have provided improved methods for enhanced gas delivery in a semiconductor process chamber.

SUMMARY

Embodiments of an apparatus for gas delivery in a semiconductor processing system are provided herein. In some embodiments, an apparatus for gas delivery in a semiconductor processing system comprises a gas distribution plate having a plurality of gas passageways, at least one of the plurality of gas passageways having surfaces with a roughness of less than or equal to approximately 10 Ra.

In some embodiments, a process chamber comprises a chamber body having a substrate support disposed within an inner processing volume of the chamber body and a showerhead disposed within the inner processing volume of the chamber body opposite the substrate support wherein the showerhead comprises a gas distribution plate having a plurality of gas passageways, at least one of the plurality of gas passageways having surfaces with a roughness of less than or equal to approximately 10 Ra and a flange which engages with a periphery of the gas distribution plate to provide support for mounting to a component of the process chamber.

In some embodiments, a method of forming a gas delivery apparatus comprises providing a mandrel with a conductive base on which to form a gas distribution plate, engaging at least one pin with the mandrel, the pin having an average surface roughness of less than or equal to approximately 10 Ra, electroforming a nickel material onto the mandrel to form the gas distribution plate, removing the gas distribution plate from the mandrel, and electroforming the gas distribution plate to a flange to form the gas delivery apparatus.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1:
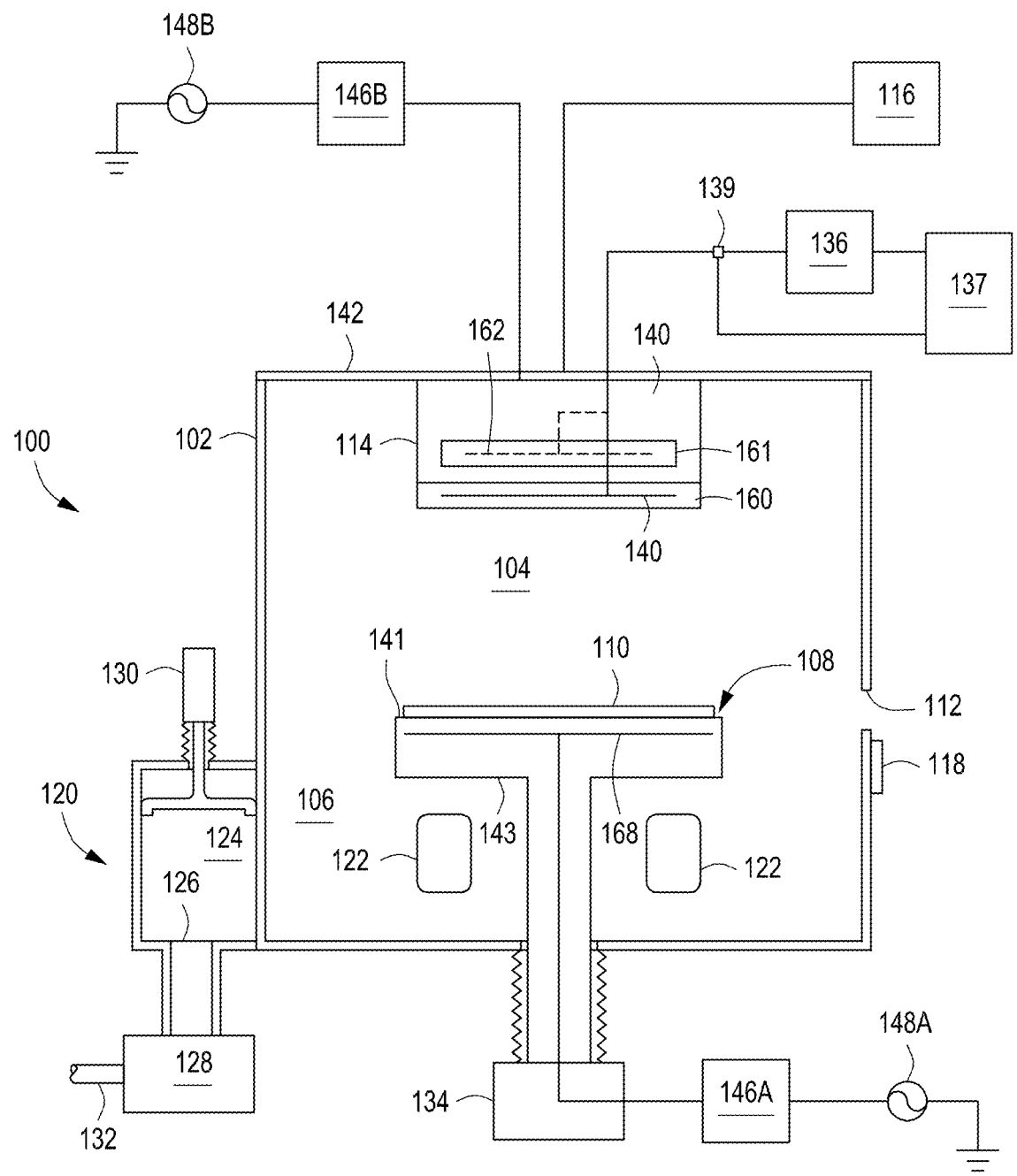
FIG. 1 depicts a schematic cross-sectional view of a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The inventors have observed that a conventional gas delivery apparatus has gas passageways or 'holes' with a high surface roughness. Gas turbulence caused by the surface roughness within the passageways may lead to undesirable process results such as non-uniform depositions and etchings. Embodiments of the present principles advantageously provide a gas delivery apparatus with reduced gas passageway surface roughness that results in less turbulent gas delivery during processing. Additionally, the gas delivery apparatus may also beneficially control the thermal properties of the gas delivery apparatus during processing, providing higher quality products. In some embodiments, the apparatus may advantageously provide a gas distribution plate used as a "faceplate" of a showerhead having a plurality of passageways which provide a smoother and more uniform gas flow rate and, in some embodiments, with a more uniform control of temperature. In some embodiments, the apparatus may advantageously provide a gas distribution plate used as a "blocker plate" of a showerhead having a plurality of passageways which provide a smoother and more uniform gas flow rate and, in some embodiments, with a more uniform control of temperature.

FIG. 1 depicts a process chamber 100 suitable for use in connection with an apparatus for gas delivery in accordance with some embodiments of the present principles. Other suitable chambers include any chambers that incorporate a gas delivery apparatus such as, for example, a showerhead to perform substrate fabrication processes.

In some embodiments, the process chamber 100 generally comprises a chamber body 102 defining an inner processing volume 104 and an exhaust volume 106. The inner processing volume 104 may be defined, for example, between a substrate support 108 disposed within the process chamber 100 for supporting a substrate 110 thereupon during processing and one or more gas inlets, such as a showerhead 114 and/or nozzles provided at predetermined locations. The exhaust volume may be defined, for example, between the substrate support 108 and a bottom of the process chamber 100.

The substrate support 108 generally comprises a body 143 having a substrate support surface 141 for supporting a substrate 110 thereon. In some embodiments, the substrate support 108 may include an apparatus that retains or supports the substrate 110 on the surface of the substrate support 108, such as an electrostatic chuck, a vacuum chuck, a substrate retaining clamp, or the like (not shown).

In some embodiments, the substrate support 108 may include a radio frequency (RF) bias electrode 168. The RF bias electrode 168 may be coupled to one or more RF bias power sources through one or more respective matching networks (one RF bias power source 148A and one matching network 146A shown in FIG. 1). The one or more bias power sources may be capable of producing up to 12000 W at a frequency of about 2 MHz, or about 13.56 MHz, or about 60 MHz. In some embodiments, two bias power sources may be provided for coupling RF power through respective matching networks to the RF bias electrode at a frequency of about 2 MHz and about 13.56 MHz. In some embodiments, three bias power sources may be provided for coupling RF power through respective matching networks to the RF bias electrode at a frequency of about 2 MHz, about 13.56 MHz, and about 60 MHz. The at least one bias power source may provide either continuous or pulsed power. In some embodiments, the bias power source may be a DC or pulsed DC source.

In some embodiments, the substrate support 108 may include one or more mechanisms for controlling the temperature of the substrate support surface 141 and the substrate 110 disposed thereon. For example, one or more channels (not shown) may be provided to define one or more flow paths beneath the substrate support surface to flow a heat transfer medium similar to as described below with respect to the showerhead 114.

The one or more gas inlets (e.g., the showerhead 114) may be coupled to a gas supply 116 for providing one or more process gases into the inner process volume 104 of the process chamber 100. Although a showerhead 114 is shown, additional gas inlets may be provided such as nozzles or inlets disposed in the ceiling or on the sidewalls of the process chamber 100 or at other locations suitable for providing gases to the process chamber 100, such as the base of the process chamber, the periphery of the substrate support, or the like.

In some embodiments, one or more RF plasma power sources (one RF plasma power source 148B shown) may be coupled to the process chamber 100 through one or more matching networks 146B for providing power for processing. In some embodiments, the process chamber 100 may utilize capacitively coupled RF power provided to an upper electrode proximate an upper portion of the process chamber 100. The upper electrode may be a conductor in an upper portion of the process chamber 100 or formed, at least in part, by one or more of a ceiling 142, the showerhead 114, or the like, fabricated from a suitable conductive material. For example, in some embodiments, the one or more RF plasma power sources 148B may be coupled to a conductive portion of the ceiling 142 of the process chamber 100 or to a conductive portion of the showerhead 114. The ceiling 142 may be substantially flat, although other types of ceilings, such as dome-shaped ceilings or the like, may also be utilized. The one or more plasma sources may be capable of producing up to 5000 W at a frequency of about 2 MHz and/or about 13.56 MHz, or higher frequency, such as 27 MHz and/or 60 MHz and/or 162 MHz. In some embodiments, two RF power sources may be coupled to the upper electrode through respective matching networks for providing RF power at frequencies of about 2 MHz and about 13.56 MHz. Alternatively, the one or more RF power sources may be coupled to inductive coil elements (not shown) disposed proximate the ceiling of the process chamber 100 to form a plasma with inductively coupled RF power.

In some embodiments, the inner process volume 104 may be fluidly coupled to an exhaust system 120. The exhaust system 120 may facilitate uniform flow of the exhaust gases from the inner process volume 104 of the process chamber 100. The exhaust system 120 generally includes a pumping plenum 124 and a plurality of conduits (not shown) that couple the pumping plenum 124 to the inner process volume 104 of the process chamber 100. A conduit has an inlet 122 coupled to the inner process volume 104 (or, in some embodiments, the exhaust volume 106) and an outlet (not shown) fluidly coupled to the pumping plenum 124. For example, a conduit may have an inlet 122 disposed in a lower region of a sidewall or a floor of the process chamber 100. In some embodiments, the inlets are substantially equidistantly spaced from apart.

A vacuum pump 128 may be coupled to the pumping plenum 124 via a pumping port 126 for pumping out the exhaust gases from the process chamber 100. The vacuum pump 128 may be fluidly coupled to an exhaust outlet 132 for routing the exhaust to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

In operation, the substrate 110 may enter the process chamber 100 via an opening 112 in the chamber body 102. The opening 112 may be selectively sealed via a slit valve 118, or other apparatus for selectively providing access to the interior of the chamber through the opening 112. The substrate support 108 may be coupled to a lift apparatus 134 that may control the position of the substrate support 108 between a lower position (as shown) suitable for transferring substrates into and out of the chamber via the opening 112 and a selectable upper position suitable for processing. The process position may be selected to maximize process uniformity for a particular process step. When in an elevated processing position, the substrate support 108 may be disposed above the opening 112 to provide a symmetrical processing region. After the substrate 110 is disposed within the process chamber 100, the chamber may be pumped down to a pressure suitable for forming a plasma and one or more process gases may be introduced into the chamber via the showerhead 114 (and/or other gas inlets). RF power may be provided to strike and maintain a plasma from the process gases to process the substrate.

During processing, such as in the above example, the temperature of the showerhead 114 may be controlled to provide a more uniform temperature profile across a substrate-facing surface of the showerhead 114. The showerhead 114 may include one or more mechanisms for controlling the temperature of the showerhead 114. For example, in some embodiments, one or more fluid passageways may be disposed internal to the showerhead 114 to further facilitate control over the temperature of a gas distribution plate of the present principles used as a faceplate 160 of the showerhead 114. In some embodiments, the showerhead 114 also incorporates a gas distribution plate of the present principles as an optional blocker plate 161 which may also include one or more fluid passageways to facilitate in controlling the temperature of the blocker plate.

In addition, a first set of one or more channels 140 may be provided in the faceplate 160, of the showerhead 114, to define one or more flow paths (described more fully below) to flow a heat transfer medium through the one or more channels 140. A second set of one or more channels 162 may be optionally provided in the optional blocker plate 161 of the showerhead 114, to define one or more flow paths (described more fully below) to flow a heat transfer medium through the optional blocker plate 161. The heat transfer medium may comprise any fluid suitable to provide adequate transfer of heat to or from a component of the showerhead 114 (e.g., blocker plate, faceplate, etc.). For example, the heat transfer medium may be a gas, such as helium (He), oxygen (O2), or the like, or a liquid, such as water, antifreeze, or an alcohol, for example, glycerol, ethylene glycerol, propylene, methanol, or refrigerant fluid such as FREON® (e.g., a chlorofluorocarbon or hydrochlorofluorocarbon refrigerant), ammonia or the like. The optional blocker plate 161 and the faceplate 160 may have different heat transfer mediums and/or different heat transfer parameters, such as, for example flow rate.

A heat transfer medium source 136 may be coupled to the channels 140, 162 to provide the heat transfer medium to the one or more channels 140, 162. The heat transfer medium source 136 may comprise a temperature control apparatus, for example a chiller or heater, to control the temperature of the heat transfer medium. One or more valves 139 (or other flow control devices) may be provided between the heat transfer medium source 136 and the one or more channels 140, 162 to independently control a rate of flow of the heat transfer medium to the one or more channels 140, 162. A controller 137 may control the operation of the one or more valves 139 and/or of the heat transfer medium source 136.

In some embodiments, one or more heatsinks (not shown) may be embedded into the showerhead 114, including, for example, in the faceplate 160 or optional blocker plate 161. The heatsinks help to stabilize the temperature of the faceplate 160 or an optional blocker plate 161. The heatsinks may be made of a material different from the material used to make the showerhead 114 (including the faceplate or blocker plate). In some embodiments, the heatsinks are made, at least partially, of a copper-based material.

The following examples illustrate embodiments with a gas distribution plate used as a faceplate in a showerhead of a semiconductor processing apparatus. However, other embodiments utilize a gas distribution plate as a blocker plate internal to a showerhead of a semiconductor processing apparatus. The formation of the gas passageways and the heat transfer passageways is similar in both types of embodiments so, for the sake of brevity, examples of gas distribution plates utilized as faceplates are shown. However, the techniques of the present principles may also be employed in the formation of blocker plates and other types of gas distribution plates.

Figure 2:
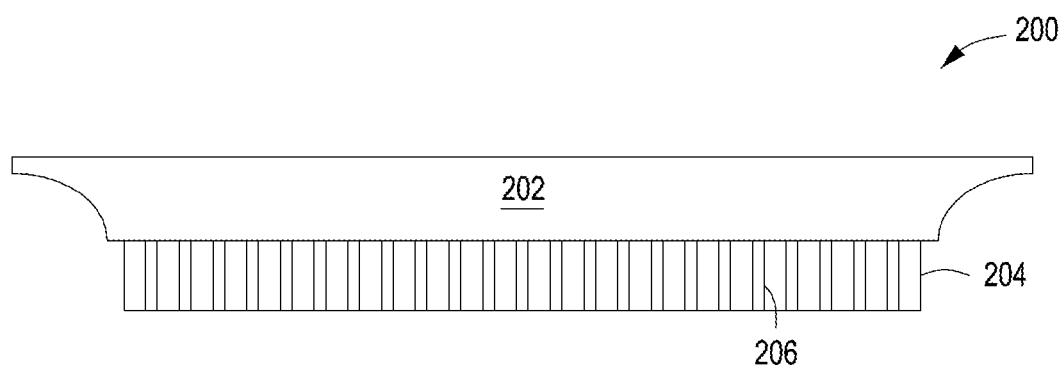
FIG. 2 depicts a schematic cross-sectional view of an apparatus for gas delivery in accordance with some embodiments of the present principles.

FIG. 2 depicts a schematic cross-sectional view of an apparatus 200 for gas delivery in accordance with some embodiments of the present principles. The apparatus 200 (e.g., "showerhead") has a flange 202 that engages with a gas distribution plate 204. In some embodiments, the flange 202 has an approximately uniform thickness. The apparatus 200 can be comprised of two separate pieces joined in a temporary (e.g., screws, clamps, etc.) or permanent manner (e.g., cold welding, etc.). The apparatus 200 can also be comprised of a single piece that includes both the flange 202 and the gas distribution plate 204. The gas distribution plate 204 includes at least one gas passageway 206 or 'hole' having inner surfaces. The fluids (e.g., gas, liquid, etc.) are influenced by the passageways as the fluids pass through the passageways.

The influences can include affecting the fluid velocity (e.g., decreasing, increasing), the fluid density (e.g., expanding, compacting), and the fluid temperature (e.g., increasing, decreasing). The passageways can also have an impact the fluid's laminar flow. If the inner surfaces of the passageway are rough, the laminar flow will be disrupted, causing turbulent fluid delivery into the process chamber 100. The turbulence can cause non-uniform gas delivery with negative effects on substrate processing within the process chamber 100. The turbulence can impact fluid parameters such as density, velocity, and temperature. In some embodiments, an apparatus for gas delivery with reduced passageway surface roughness advantageously provides uniformity in the parameters such as fluid density, velocity, and temperature, increasing the quality of the substrate processing. Average surface roughness in microinches, Ra, of less than or equal to approximately 10 Ra for the inner surfaces of the gas distribution plate passageways can be achieved. By utilizing materials such as, for example, glass and other materials an average surface roughness, Ra, of less than or equal to approximately 2 Ra for the inner surfaces of the gas distribution plate passageways can be achieved. In addition, the inventors have also discovered that the processes of the present principles advantageously provide smoother transitions between passageways with varying internal diameters.

The apparatus 200 with improved passageway surface roughness can be formed in a number of ways. For the sake of brevity, the following example embodiments utilize a process known as electroforming. Electroforming uses electrochemistry and additives in plating baths to manufacture parts. Metal ions are transferred electrochemically through an electrolyte from an anode to a surface where the metal ions are deposited as atoms. In electroforming, the surface is treated so that the metal ions do not adhere. The surface is referred to as a 'mandrel.' The mandrel acts as a cathode in the plating bath. The mandrel can be permanent in that the mandrel is re-used time and again or the mandrel can be disposable in that the mandrel is destroyed in order to release an electroformed part after formation of the part. In some embodiments, the gas distribution plate 204 is made from at least two different materials, such as, for example, nickel and copper.

Figure 3:
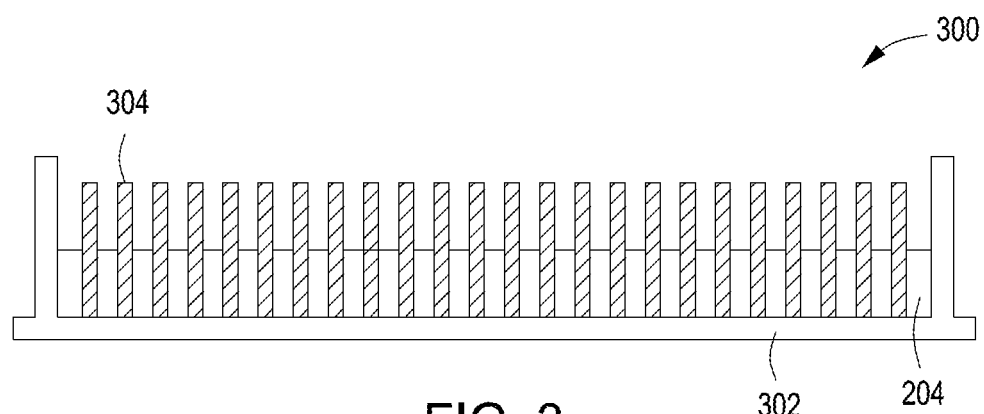
FIG. 3 depicts a schematic cross-sectional view of a mandrel with non-conductive, permanent pins in accordance with some embodiments of the present principles.

FIG. 3 depicts a schematic cross-sectional view of a mandrel 300 with pins 304 that are non-conductive and permanent in accordance with some embodiments of the present principles. The mandrel 300 is an example of a form or jig that can be used in an electroforming process to create, for example, the apparatus 200 of FIG. 2. In some embodiments, the mandrel 300 has a base 302 with pins 304 that are made from non-conductive material (will not attract metal ions during electroforming) and are reused (permanent). The pins 304 can be formed from materials such as, for example, glass, plastics (including nylon and extruded nylon (e.g., "fishing line"), etc. The pins 304 can be, for example, nylon fishing line with varying diameters that is threaded through holes in the base 302 of the mandrel 300 and looped through or attached to an overhead loom apparatus to act as "pins" during the electroforming process. The pins or fishing line are generally oriented at right angles to the base 302 but, in some embodiments, other angles can be used to provide different gas delivery angles for a gas delivery apparatus. Glass rods can also be used as material for the pins 304 due to the low surface roughness of glass. An average surface roughness or Ra of less than or equal to 2 can be achieved.

An electroforming process is used to form a gas distribution plate 204 that is substantially uniform on the base 302 and around the pins 304. Because the pins 304 are non-conductive, materials used in electroforming process are not attracted to the pins 304. The non-attraction allows the materials to build up on the base 302 in a somewhat uniform thickness to form the gas distribution plate 204. The pins 304 can also be easily separated from the gas distribution plate and are 'permanent' in the sense that the pins 304 do not need to be sacrificed to remove the gas distribution plate 204 from the mandrel 300 and can be reused to make additional gas distribution plates. The gas distribution plate can be removed from the mandrel 300 and used or the gas distribution plate can be further processed such as machining surfaces and/or insuring uniform thicknesses. The gas distribution plate can also be machined to properly engage a flange 202 and/or to be cold welded to a flange 202.

Figure 4A:
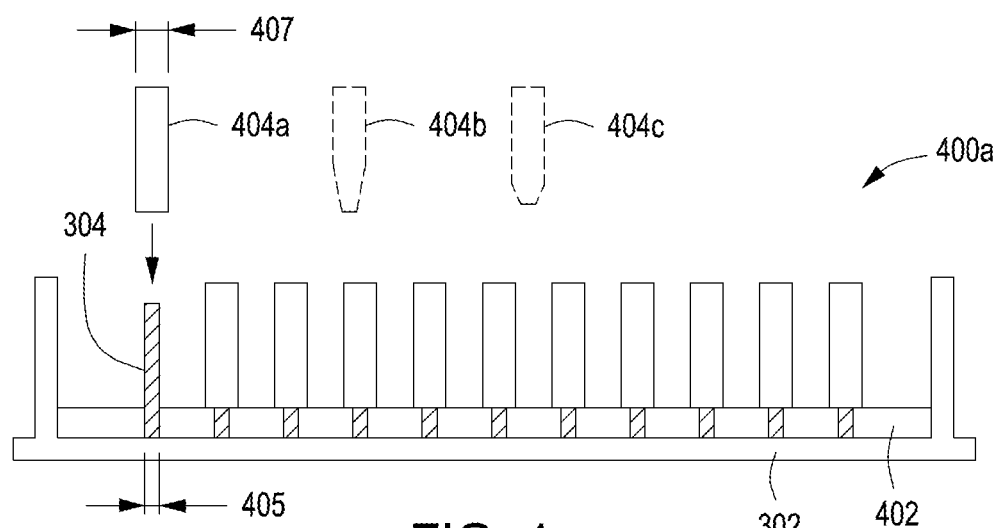
FIG. 4a depicts a schematic cross-sectional view of a mandrel with non-conductive, permanent pins and tubes in accordance with some embodiments of the present principles.

FIG. 4a depicts a schematic cross-sectional view of a mandrel 400a with pins 304 that are non-conductive and permanent and with tubes 404a, 404b, 404c in accordance with some embodiments of the present principles. The mandrel 400a includes the base 302 and the pins 304 from FIG. 3. An electroforming process has deposited a first layer of material 402 onto the mandrel 400a. The pins 304 produce a passageway in the first layer of material 402 with a first diameter 405. Before continuing the electroforming process, the first layer of material 402 can be removed or left in situ and machined or otherwise processed before continuing. The additional processing can include, but is not limited to, machining a top surface of the first layer of material 402 to achieve a uniform thickness of the first layer of material 402. After processing, the first layer of material 402 can be returned to the mandrel 400a for additional electroforming.

The tube 404a has a cylindrical opening in the center of the tube 404a that is slightly larger than the first diameter 405 of the pins 304. The opening allows the tube 404a to slide over the pins 304 and engage with the first layer of material 402. Once the tube 404a is placed over the pins 304, the mandrel 400a can now be use to form a gas passageway with a diameter equal to a second diameter 407 which is the outer diameter of the tube 404a. Optional tubes 404b, 404c are examples of other shapes that can be used that allow for easy removal from a formed gas distribution plate (reusable or "permanent"). The shapes of the optional tubes 404b, 404c allow for a smoother transition from the first diameter 405 to the second diameter 407 within a passageway of a gas distribution plate. Other shapes (e.g., square, oval, hour-glass, etc.) can also be utilized in place of the examples illustrated.

Figure 4B:
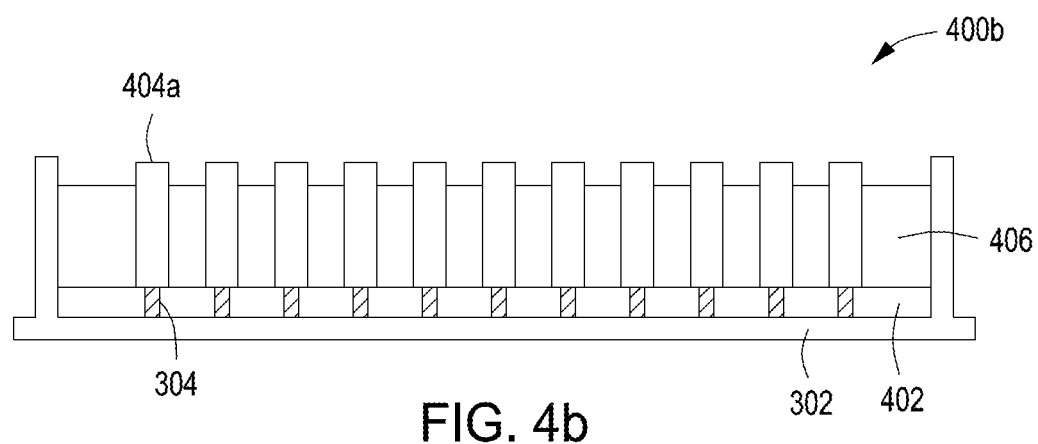
FIG. 4b depicts a schematic cross-sectional view of a mandrel with non-conductive, permanent pins and tubes after forming an apparatus for gas delivery in accordance with some embodiments of the present principles.

FIG. 4b depicts a schematic cross-sectional view of a mandrel 400b with pins 304 that are non-conductive and permanent and with tubes 404a after forming an apparatus for gas delivery in accordance with some embodiments of the present principles. The mandrel 400b uses, for illustrative purposes only, the tubes 404a (optional tubes 404b, 404c and/or a combination of tube variants shown and not shown may also be used). An electroforming process has deposited a second layer of material 406 onto the first layer of material 402. Once the mandrel 400b is removed, the combined first layer of material 402 and the second layer of material 406 form a gas distribution plate. The gas distribution plate in the example will have gas passageways with two different diameters. The varying diameters can be used to change gas pressures, temperatures, and velocities of delivered gases. The gas distribution plate can be removed from the mandrel 400b and used or the gas distribution plate can be further processed such as machining surfaces and/or insuring uniform thicknesses. The gas distribution plate can also be machined to properly engage a flange 202 and/or to be cold welded to a flange 202 as a faceplate. The gas distribution plate can also be incorporated as a blocker plate.

Figure 5:
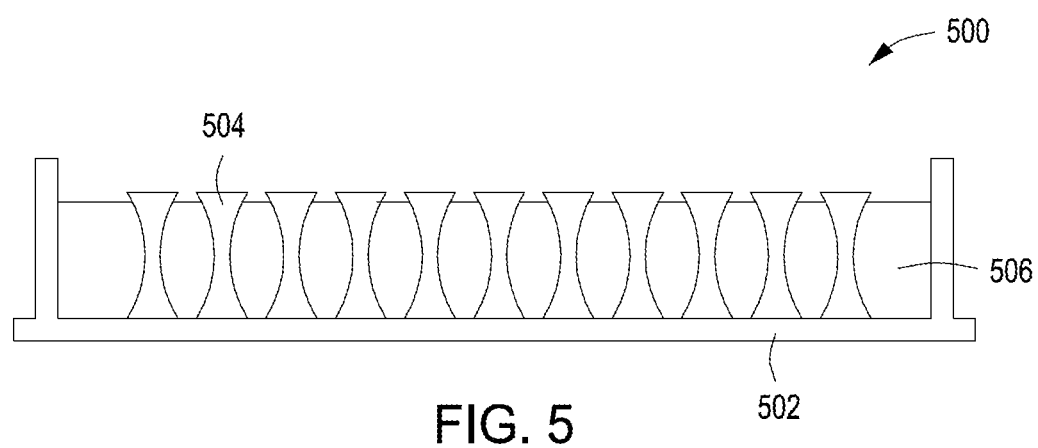
FIG. 5 depicts a schematic cross-sectional view of a mandrel with non-conductive, disposable pins in accordance with some embodiments of the present principles.

FIG. 5 depicts a schematic cross-sectional view of a mandrel 500 with pins 504 that are non-conductive and disposable in accordance with some embodiments of the present principles. In some embodiments, the mandrel 500 has a base 502 with pins 504. Because the pins 504 are non-conductive, an electroforming process will distribute a somewhat uniform layer of material 506 onto the mandrel 500. The pins 504 are made disposable because the pins 504 cannot be easily removed from the layer of material 506 due to the shape of the pins 504. The pins 504 will be sacrificed after an electroforming process. The removing of the pins 504 can be accomplished by heat (e.g., wax based pins), by etching (e.g., using etchant that only etches the material used for pins 504), and other chemical or mechanical means.

The gas distribution plate can be removed from the mandrel 500 and used or the gas distribution plate can be further processed such as machining surfaces and/or insuring uniform thicknesses. The gas distribution plate can also be machined to properly engage a flange 202 and/or to be cold welded to a flange 202.

Figure 6:
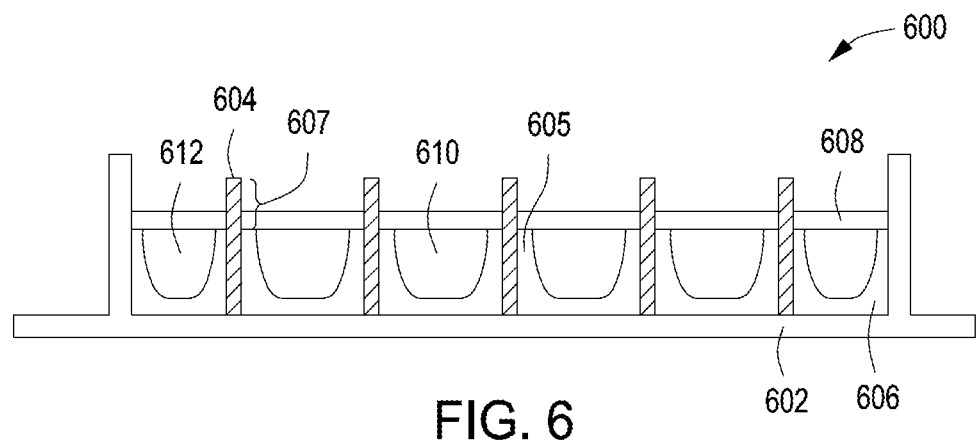
FIG. 6 depicts a schematic cross-sectional view of a mandrel with conductive pins in accordance with some embodiments of the present principles.

FIG. 6 depicts a schematic cross-sectional view of a mandrel 600 with pins 604 that are made of a conductive material in accordance with some embodiments of the present principles. The mandrel 600 has a base 602 with pins 604 that will attract metal ions in an electroforming process. Although the diameter of the pins 604 is uniform in the illustration, the diameter can be non-uniform as well (curved shape, angled shape, hour-glass shape, etc.). In some embodiments, a first layer of material 606 is deposited using an electroforming process. Since the pins 604 attract metal ions, the pins 604 and the base 602 are coated with a layer of the metal. The process forms a rough hollow cone 605 around the pins 604. In some electroforming processes, a substance such as, for example, a wax or other substance that can be removed from a formed piece is used to fill one or more cavities 610 that surround the rough hollow cones 605. By selectively filling cavities 610, various configurations can be achieved for fluid passages to allow temperature control of a gas distribution plate. For example, forming fluid passages near an outer edge of the gas distribution plate can control an edge temperatures of the gas distribution plate. Similarly, for example, forming fluid passages near a center of the gas distribution plate can control central temperatures of the gas distribution plate.

Before continuing the electroforming process, the first layer of material 606 can be removed or left in situ and machined or otherwise processed before continuing. The additional processing can include, but is not limited to, machining a top surface of the first layer of material 606 to achieve a uniform thickness of the first layer of material 606. After processing, the first layer of material 606 can be returned to the mandrel 600 for additional electroforming.

A second layer of material 608 is then electroformed over the substance and the first layer of material 606. A metallic coating can be used on the substance in the cavities to attract metal ions to form a substantially uniform layer. The metallic coating, for example, can be sprayed on the substance before electroforming. In some embodiments, the second layer of material 608 can be machined to remove any non-uniformity in thickness that can be caused by the metal ion attraction to the pins 604 during formation of the second layer of material 608. In some embodiments, a portion 607 of the pins 604 beyond a top surface of the first layer of material 606 can be made of a non-conductive material to aid in the uniformity of the second layer, possibly forgoing a need for further machining.

The gas distribution plate can be removed from the mandrel 600 and used or the gas distribution plate can be further processed such as machining surfaces and/or insuring uniform thicknesses. The gas distribution plate can also be machined to properly engage a flange 202 and/or to be cold welded to a flange 202 as a faceplate. The gas distribution plate can also be utilized as a blocker plate.

In some embodiments, a cavity 612 can be constructed along a periphery of an apparatus for gas delivery using similar processes as described above. Inner pins can be non-conductive to produce a uniform first layer of material while outer conductive components can be used to produce a fluid channel along the periphery. The strategic use of conductive and non-conductive components can be used to selectively create cavities in a gas distribution plate. In some embodiments, the cavities formed around the passageways during the electroforming process can be filled with heatsink materials. The process allows heatsinks to be embedded throughout a gas distribution plate (e.g., surrounding one or more passageways) or in selective locations to aid in achieving uniform temperature control of the gas distribution plate. The heatsink material can be left exposed (e.g., no second layer of material 608 formed) or partially embedded (e.g., a second layer of material 608 formed). In some embodiments, a combination of heatsinks and fluid passages in the gas distribution plate can be created to control temperature of the gas distribution plate.

Figure 7:
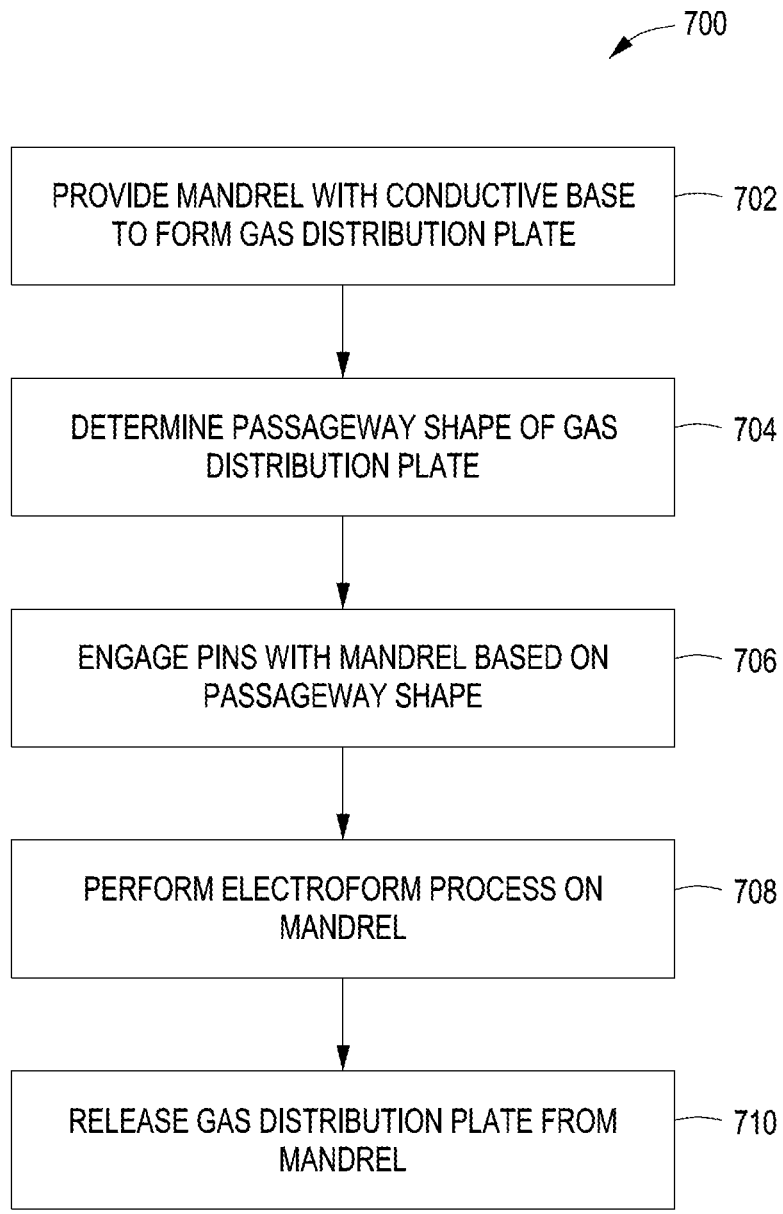
FIG. 7 is a flowchart illustrating a method of forming an apparatus for gas delivery in accordance with some embodiments of the present principles.

FIG. 7 is a flowchart illustrating a method 700 of forming an apparatus for gas delivery in accordance with embodiments of the present principles. The method starts by providing a mandrel with a conductive base to form a gas distribution plate 702. The conductive base generally helps in forming one surface of the gas distribution plate and the general shape of the gas distribution plate. The mandrel can also include a fastening means to secure pins used to form passageways in the gas distribution plate. The fastening means can include for example, holes for threading lines through (e.g., fishing line or nylon line used as pins for forming the passageways), recesses for pins (e.g., friction holding of glass rods, plastic pins, etc.), and/or screws or other permanent or semi-permanent fastening means. The passageway shape is then determined for the gas distribution plate 704. The shapes can include, but are not limited to, cylinders, hour-glass (pinched centers), cylinders with stepped diameters, cylinders with gradually decreasing diameters, and/or cylinders with abrupt diameter changes. The shapes are not limited to cylindrical shapes. Squared, triangular, oval, and/or other shaped passageways can also be achieved with embodiments of the present principles. The pins are then engaged with the mandrel based on the passageway shape 706. In some embodiments, the pins may have multiple parts (e.g., pin and tube, etc.) and may be conductive or non-conductive, a combination of conductive and non-conductive portions, and may be permanent or disposable to create a passageway in the gas distribution plate.

The electroform process is then performed on the mandrel 708. The electroform process may include multiple electroforming processes to form multiple layers of similar materials or different materials or to form cavities within the gas distribution plate or to embed heatsinks in the gas distribution plate. Additional machining or other processing may be performed between one or more of the multiple layers. The gas distribution plate is then released from the mandrel 710. After releasing, further machining may be performed or the gas distribution plate may be used without machining. Disposable portions of the pins or tubes may be etched away or otherwise removed. Waxes or other removable substances used during the processes may be removed from internal and/or external cavities and the like as well.

Every block of the method 700 is not required to be performed and some of the blocks may be performed out of order. Some of the blocks may also be repeated.

While the foregoing is directed to embodiments of the present disclosure, other and further embodiments of the disclosure may be devised without departing from the basic scope thereof.

The invention claimed is:

1. An apparatus for gas delivery in a semiconductor processing system, comprising:
   a gas distribution plate formed of electroformed, monolithic nickel structure;
   a plurality of gas passageways that extend through an uppermost surface of the gas distribution plate to a lowermost surface of the gas distribution plate, wherein at least one of the plurality of gas passageways has uncoated and non-machined nickel surfaces throughout and wherein the at least one of the plurality of gas passageways has a nonconstant diameter with a curved inner sidewall throughout the gas distribution plate;
   at least one cavity that surrounds one of the plurality of gas passageways internally to the gas distribution plate, wherein the at least one cavity is fluidly separated from any of the plurality of gas passageways: and
   an electroformed heatsink material only partially filling the at least one cavity.

2. The apparatus of claim 1, wherein the gas distribut n plateis block3 plate in a showerhead of the semiconductor processing system.

3. The apparatus of claim 1, wherein the gas distribution plate has an internal fluid passageway only around a periphery of the gas distribution plate, the internal fluid passageway capable of being fluidly coupled to a fluid source to provide temperature control of the gas distribution plate.

4. The apparatus of claim 1, wherein the electroformed heatsink material is comprised of a copper-based material.

5. The apparatus of claim 1, wherein at least one of the plurality of gas passageways has nickel surfaces with a roughness of less than or equal to glass.

6. The apparatus of claim 1, further comprising:
   a flange which engages with a periphery of the gas distribution plateo provide support for mounting in the semiconductor processing system.

7. The apparatus of claim 6, wherein the gas distribution plate and the flange are engaged by cold welding.

8. A process chamber, comprising:
   a chamber body has a substrate support disposed within an inner processing volume of the chamber body; and a showerhead disposed within the inner processing volume the chamber body opposite the substrate support, the showerhead comprising:
  at least one gas distribution plate formed of an electroformed, monolithic nickel structure;
  a plurality of gas passageways that extend through an uppermost surface of the gas distribution plate to a lowermost surface of the gas distribution plate, wherein at least one of the plurality of gas passageways has uncoated and non-machined nickel surfaces throughout and wherein the at least one of the plurality of gas passageways has a nonconstant diameter with a curved inner sidewall throughout the gas distribution plate;
  at least one cavity that surrounds one of the plurality of gas passageways internally to the gas distribution plate, wherein the at least one cavity is fluidly separated from any of the plurality of gas passageways;
  an electroformed heatsink material only partially filling the at east one cavity; and
  a flange which engages with a periphery of at least one of the at least one gas distribution plate to provide support for mounting to a component of the process chamber.

9. The process chamber of claim 8, wherein at least one f the at least one gas distribution plate and the flange are a single piece.

10. The process chamber of claim 8, wherein at least one of the at least one gas distribution plate has an internal fluid passageway around a periphery of the at least one of the at least one gas distribution plate, the internal fluid passageway capable of being fluidly coupled to a fluid source to provide temperature control of the at least one of the at least one gas distribution plate.

11. The process chamber of claim 8, wherein of the electroformed heatsink material is comprised of a copper-based material.

12. The process chamber of claim 8, wherein at least one of the plurality of gas passageways has nickel surfaces with a roughness of less than or equal to glass.

* * * * *

UNITED STATES PATENT AND TRADEMARK OFFICE
CERTIFICATE OF CORRECTION

PATENT NO. : 11,380,557 B2
APPLICATION NO. : 15/613855
DATED : July 5, 2022
INVENTOR(S) : Vincent Kirchhoff et al.

Page 1 of 1

It is certified that error appears in the above-identified patent and that said Letters Patent is hereby corrected as shown below:

In the Claims

In Column 10, Line 30, Claim 1, delete "of" and insert -- of an --
In Column 10, Line 43, Claim 1, delete "passageways:" and insert -- passageways; --
In Column 10, Line 46-47, Claim 2, delete "distribut n plateis block3" and insert -- distribution plate is a blocker --
In Column 10, Line 50, Claim 3, delete "only around" and insert -- around --
In Column 10, Line 61, Claim 6, delete "plateo" and insert -- plate to --
In Column 11, Line 1-2, Claim 8, delete "volume" and insert -- volume of --
In Column 11, Line 21, Claim 8, delete "at east" and insert -- at least --
In Column 12, Line 6, Claim 9, delete "f the" and insert -- of the --
In Column 12, Line 15, Claim 11, delete "of the" and insert -- the --

Signed and Sealed this
Thirteenth Day of September, 2022

Katherine Kelly Vidal
*Director of the United States Patent and Trademark Office*